United States Patent
Yamauchi et al.

(10) Patent No.: US 10,021,780 B2
(45) Date of Patent: Jul. 10, 2018

(54) WIRED CIRCUIT BOARD AND PRODUCING METHOD THEREOF

(71) Applicant: NITTO DENKO CORPORATION, Osaka (JP)

(72) Inventors: Daisuke Yamauchi, Osaka (JP); Hiroyuki Tanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/800,680

(22) Filed: Nov. 1, 2017

(65) Prior Publication Data

US 2018/0124912 A1 May 3, 2018

(30) Foreign Application Priority Data

Nov. 2, 2016 (JP) .................. 2016-214814

(51) Int. Cl.
*H05K 1/03* (2006.01)
*H05K 1/02* (2006.01)
(Continued)

(52) U.S. Cl.
CPC ............ *H05K 1/028* (2013.01); *H05K 3/064* (2013.01); *H05K 3/18* (2013.01); *H05K 2201/0191* (2013.01); *H05K 2201/09736* (2013.01)

(58) Field of Classification Search
CPC . H05K 2201/09736; H05K 2201/0191; H05K 2201/09845; H05K 1/111; H05K 1/028; H05K 3/064; H05K 3/18
(Continued)

(56) References Cited

U.S. PATENT DOCUMENTS 6,252,176 B1 * 6/2001 Kuramochi ............ H05K 1/024
174/254
6,404,594 B1 6/2002 Maruyama et al.
(Continued)

FOREIGN PATENT DOCUMENTS

JP 2000-268336 A 9/2000
JP 2002-158411 A 5/2002
(Continued)

*Primary Examiner* — Steven T Sawyer
(74) *Attorney, Agent, or Firm* — Edwards Neils LLC; Jean C. Edwards, Esq.

(57) ABSTRACT

A wired circuit board includes an insulating layer and a conductive layer. The insulating layer continuously has a first insulating portion, a second insulating portion having a thickness smaller than that of the first insulating portion, and a third insulating portion disposed between the first insulating portion and the second insulating portion and having a thickness that gradually becomes smaller from the first insulating portion toward the second insulating portion. The conductive layer continuously has a first conductive portion disposed at one-side surface of the first insulating portion and a second conductive portion disposed at one-side surface of the second insulating portion and having a thickness smaller than that of the first conductive portion. The first conductive portion is disposed at one-side surface of the second insulating portion and the third insulating portion or is disposed at one-side surface of the first insulating portion and the third insulating portion.

3 Claims, 11 Drawing Sheets

(51) Int. Cl.
*H05K 3/06* (2006.01)
*H05K 3/18* (2006.01)

(58) Field of Classification Search
USPC .......................................................... 174/266
See application file for complete search history.

(56) References Cited

U.S. PATENT DOCUMENTS

| | | | | |
|---|---|---|---|---|
| 8,323,771 | B1* | 12/2012 | Huemoeller | H05K 1/116 174/265 |
| 2003/0003706 | A1* | 1/2003 | Suzuki | H01L 21/4853 438/613 |
| 2005/0039945 | A1* | 2/2005 | Matsuda | H01L 23/4985 174/254 |
| 2006/0049518 | A1* | 3/2006 | Kurosawa | H01L 23/3114 257/737 |
| 2007/0144775 | A1* | 6/2007 | Hasegawa | H05K 3/421 174/262 |
| 2010/0263208 | A1* | 10/2010 | Arifuku | H05K 3/361 29/830 |
| 2011/0317312 | A1 | 12/2011 | Yamaguchi | |
| 2013/0081568 | A1* | 4/2013 | Happoya | H05K 3/022 118/58 |
| 2014/0177106 | A1 | 6/2014 | Shirafuji | |
| 2014/0262441 | A1* | 9/2014 | Wu | H05K 1/0253 174/250 |

FOREIGN PATENT DOCUMENTS

| | | |
|---|---|---|
| JP | 2006-310491 A | 11/2006 |
| JP | 2010-067317 A | 3/2010 |
| JP | 2011-103357 A | 5/2011 |
| JP | 2012-009111 A | 1/2012 |
| JP | 2014-127216 A | 7/2014 |

* cited by examiner

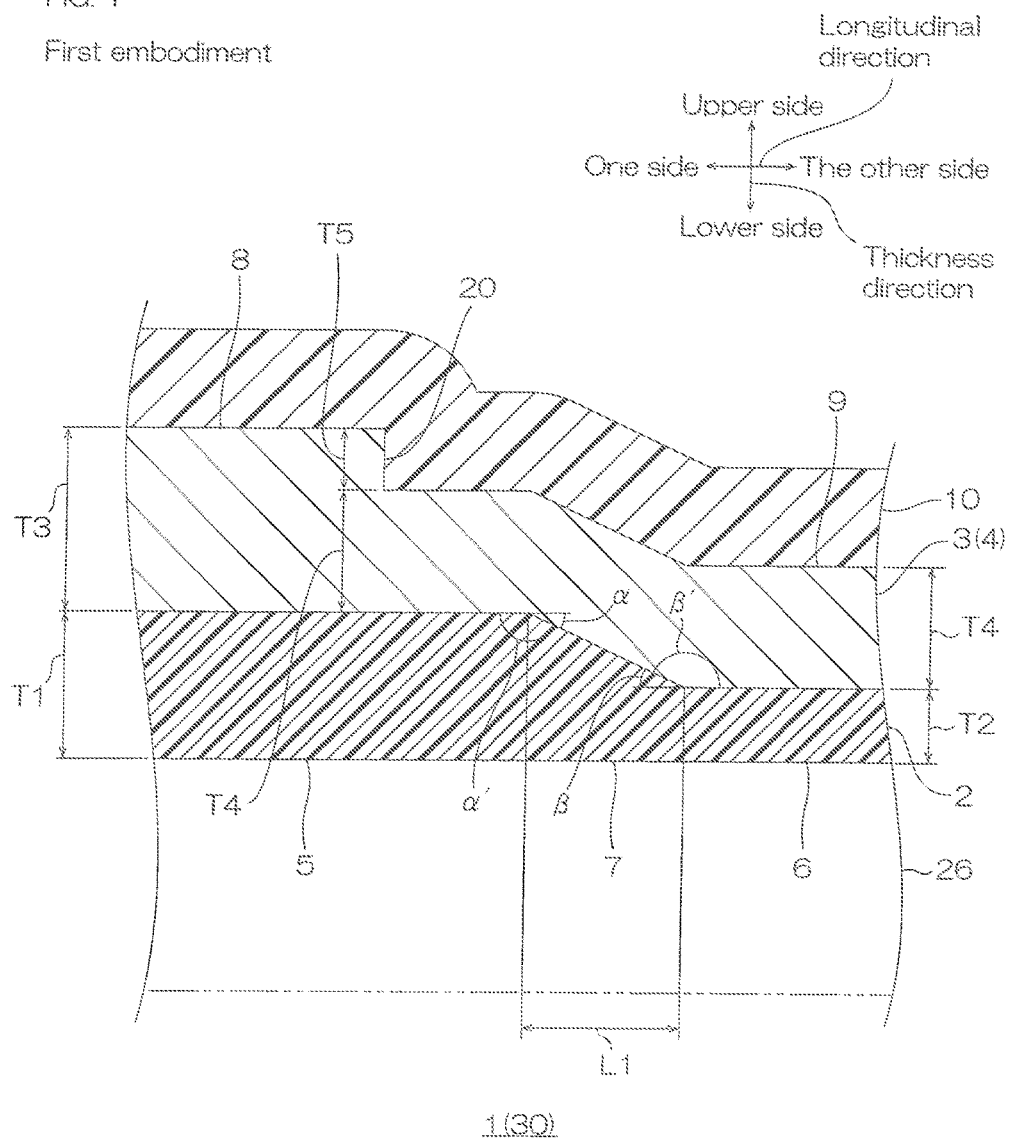

FIG. 2A
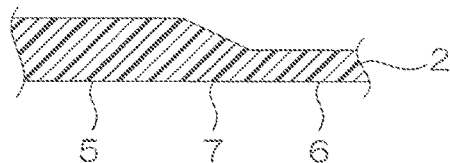
FIG. 2B
Third step
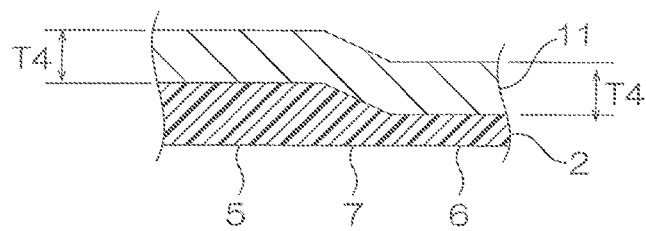
FIG. 2C
Fourth step
Fifth step
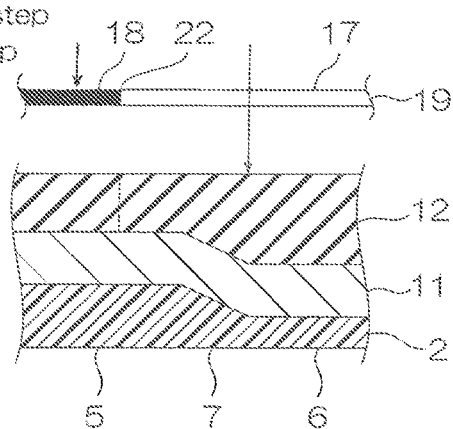
FIG. 2D
Fifth step
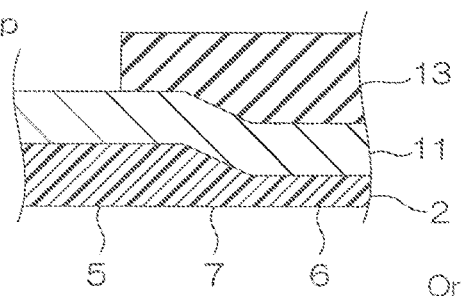
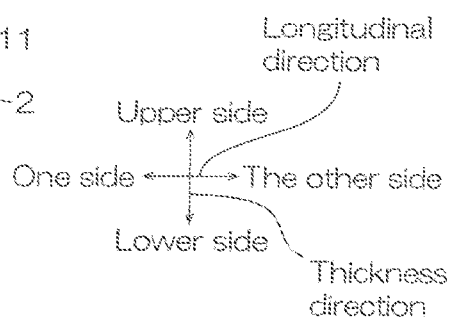

Sixth step

FIG. 4
Comparative example 1
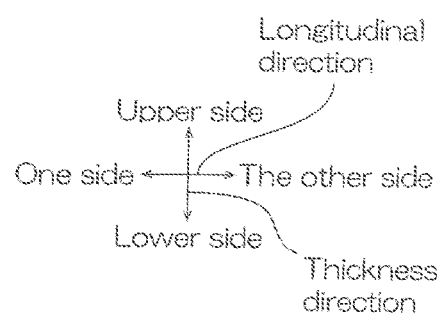
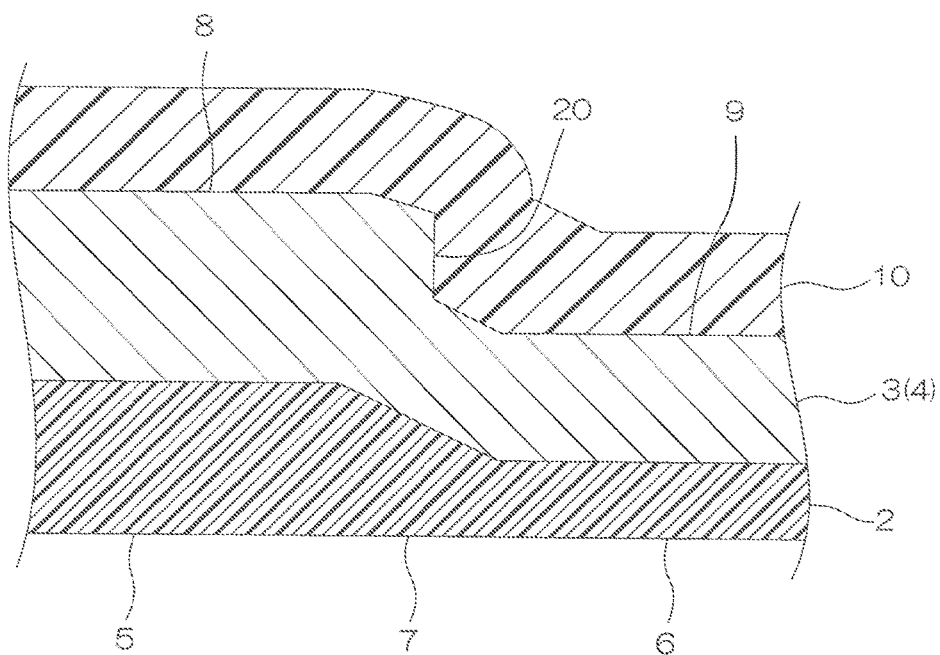

Comparative example 1

Fourth step
Fifth step

Fifth step

Sixth step

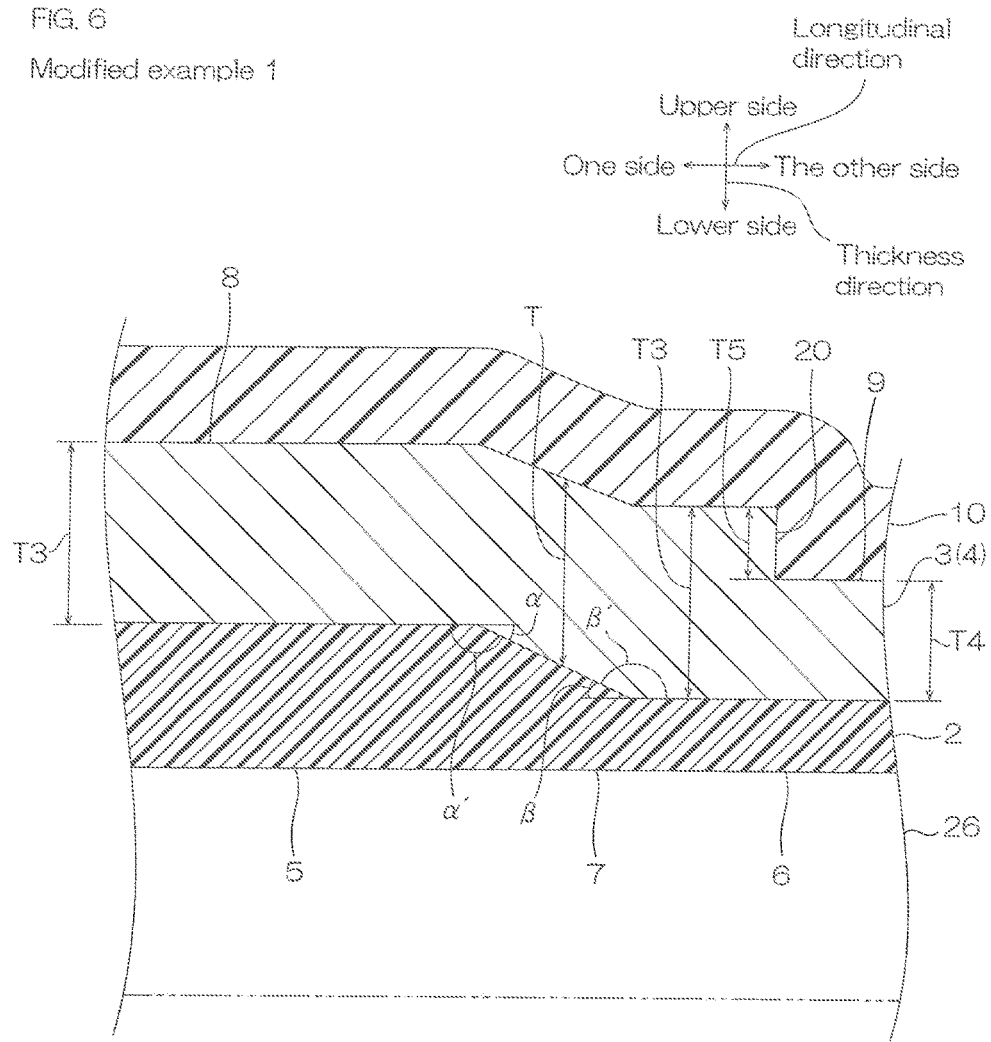

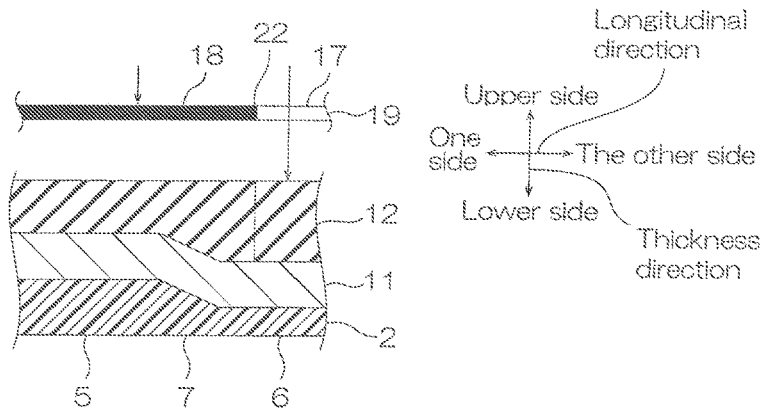
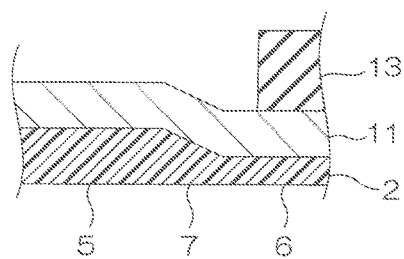
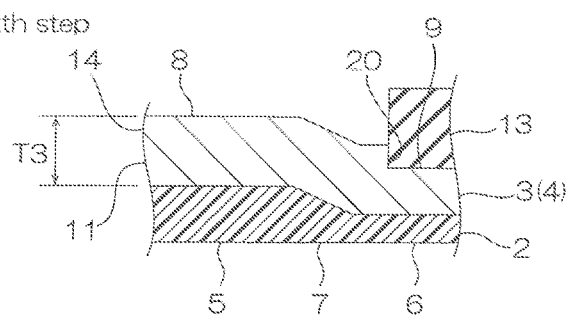
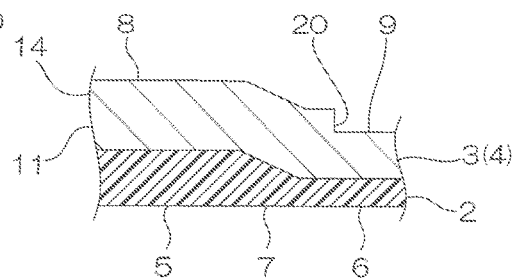

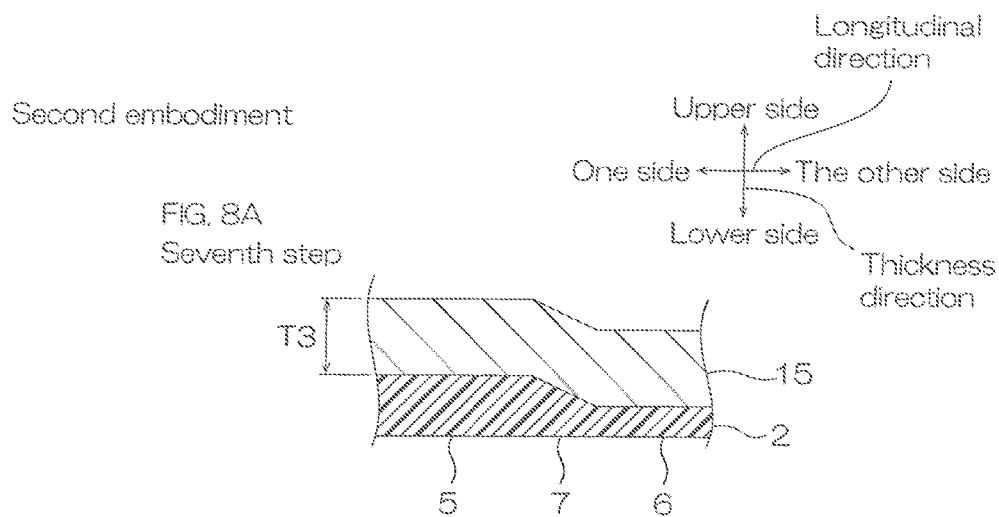
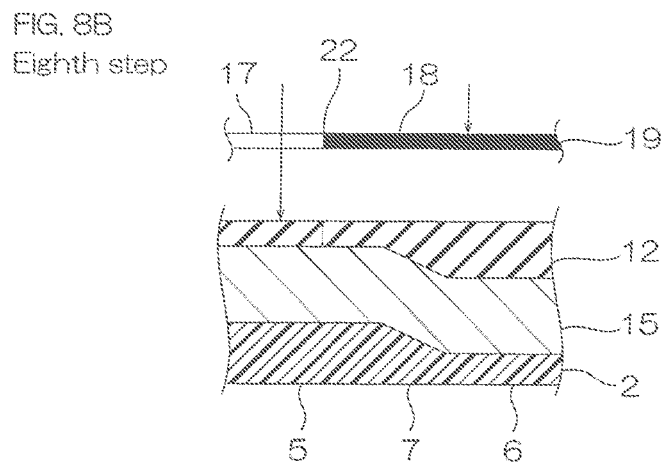
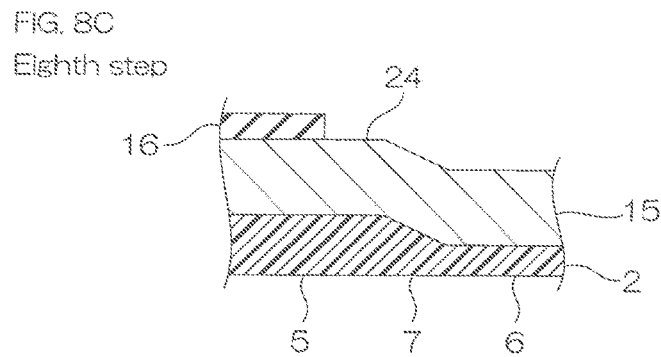

Second embodiment

Ninth step

Comparative example 2

Eighth step

Ninth step

Modified example 2

Eighth step

Ninth step

WIRED CIRCUIT BOARD AND PRODUCING METHOD THEREOF

CROSS-REFERENCE RELATED APPLICATION

The present application claims priority from Japanese Patent Application No. 2016-214814 filed on Nov. 2, 2016, the contents of which are hereby incorporated by reference into this application.

BACKGROUND OF THE INVENTION

Field of the Invention

The present invention relates to a wired circuit board and a producing method thereof, to be specific, to a wired circuit board and a method for producing the wired circuit board.

Description of Related Art

Conventionally, it has been known that a wired circuit board such as a suspension board with circuit sequentially includes an insulating layer and a wire pattern.

For example, in view of achieving both flexibleness and rigidity, a suspension board with circuit including an insulating layer that includes a thick portion and a thin portion which is thinner than the thick portion, and a wire pattern that is formed on the thick portion and the thin portion of the insulating layer so as to extend has been proposed (ref: for example, Japanese Unexamined Patent Publication No. 2014-127216).

In Japanese Unexamined Patent Publication No. 2014-127216, a border portion is formed between the thick portion and the thin portion, and the upper surface of the border portion inclines with respect to the upper surface of the thick portion and the upper surface of the thin portion.

Furthermore, in Japanese Unexamined Patent Publication No. 2014-127216, the wire pattern has the same thickness in a direction in which it extends.

SUMMARY OF THE INVENTION

Recently in order to achieve both further more excellent flexibleness and excellent rigidity, it has been considered that in addition to the insulating layer, the wire pattern also has a different thickness.

However, for example, when the thickness of the wire pattern changes on the upper surface of the border portion in the insulating layer, a shape defect of the wire pattern may occur.

An object of the present invention is to provide a wired circuit board capable of suppressing a shape defect of a conductive layer, and achieving both excellent flexibleness and excellent rigidity, and a producing method thereof.

The present invention [1] includes a wired circuit board including an insulating layer and a conductive layer disposed at one-side surface in a thickness direction of the insulating layer, wherein the insulating layer continuously has a first insulating portion, a second insulating portion having a thickness smaller than that of the first insulating portion, and a third insulating portion disposed between the first insulating portion and the second insulating portion and having a thickness that gradually becomes smaller from the first insulating portion toward the second insulating portion; the conductive layer continuously has a first conductive portion disposed at one-side surface in the thickness direction of the first insulating portion and a second conductive portion disposed at one-side surface in the thickness direction of the second insulating portion and having a thickness smaller than that of the first conductive portion; and the first conductive portion is further disposed at one-side surfaces in the thickness direction of the second insulating portion and the third insulating portion or the second conductive portion is further disposed at one-side surfaces in the thickness direction of the first insulating portion and the third insulating portion.

In the wired circuit board, a thick portion can be formed of two layers of the first insulating portion and the first conductive portion corresponding thereto, and a thin portion that is sufficiently thin compared to the thick portion can be formed of two layers of the second insulating portion and the second conductive portion corresponding thereto. Thus, both excellent flexibleness and excellent rigidity can be achieved by the thick portion and the thin portion.

In the wired circuit board, the first conductive portion or the second conductive portion is disposed at one-side surface in the thickness direction of the third insulating portion. That is, the border between the first conductive portion and the second conductive portion is not disposed at one side in the thickness direction of the third insulating portion in which the thickness changes. Thus, the border between the first conductive portion and the second conductive portion can be surely formed, and a shape defect of the conductive layer can be suppressed.

The present invention [2] includes a method for producing a wired circuit board including a first step of preparing an insulating layer and a second step of disposing a conductive layer at one-side surface in a thickness direction of the insulating layer, wherein the insulating layer continuously has a first insulating portion, a second insulating portion having a thickness smaller than that of the first insulating portion, and a third insulating portion disposed between the first insulating portion and the second insulating portion and having a thickness that gradually becomes smaller from the first insulating portion toward the second insulating portion; the conductive layer continuously has a first conductive portion disposed at one-side surface in the thickness direction of the first insulating portion and a second conductive portion disposed at one-side surface in the thickness direction of the second insulating portion and having a thickness smaller than that of the first conductive portion; the first conductive portion is further disposed at one-side surfaces in the thickness direction of the second insulating portion and the third insulating portion or the second conductive portion is further disposed at one-side surfaces in the thickness direction of the first insulating portion and the third insulating portion; the second step includes a third step of disposing a first conductive layer having the same thickness as that of the second conductive portion at one-side surface in the thickness direction of the insulating layer, a fourth step of disposing a photoresist at the entire one-side surface in the thickness direction of the first conductive layer, a, fifth step of forming a plating resist in a pattern reverse to the first conductive portion by exposing the photoresist to light to be developed, and a sixth step of forming a second conductive layer at one-side surface in the thickness direction of the first conductive layer exposed from the plating resist by plating; and in the sixth step, plating is performed so that the total thickness of the first conductive layer and the second conductive layer is the same as the thickness of the first conductive portion.

In the method, in the second step, the first conductive portion or the second conductive portion is disposed at one-side surface in the thickness direction of the third insulating portion. That is, in the fifth step, the end edge of the plating resist: is disposed at one side in the thickness direction of the first insulating portion or the second insulating portion without being disposed at one side in the thickness direction of the third insulating portion in which the thickness changes. Thus, in the developing of the photoresist, occurrence of retention of a developer is suppressed, and formation of a developing residue of the plating resist can be suppressed. As a result, the end edge of the second conductive layer can be surely formed, and a shape defect of the conductive layer can be suppressed.

Also, a thick portion can be formed of two layers of the first insulating portion and the first conductive portion corresponding thereto, and a thin portion that is sufficiently thin compared to the thick portion can be formed of two layers of the second insulating portion and the second conductive portion corresponding thereto. Thus, both excellent flexibleness and excellent rigidity can be achieved by the thick portion and the thin portion.

The present invention [3] includes a method for producing a wired circuit board including a first step of preparing an insulating layer and a second step of forming a conductive layer at one-side surface in a thickness direction of the insulating layer, wherein the insulating layer continuously has a first insulating portion, a second insulating portion having a thickness smaller than that of the first insulating portion, and a third insulating portion disposed between the first insulating portion and the second insulating portion and having a thickness that gradually becomes smaller from the first insulating portion toward the second insulating portion; the conductive layer continuously has a first conductive portion disposed at one-side surface in the thickness direction of the first insulating portion and a second conductive portion disposed at one-side surface in the thickness direction of the second insulating portion and having a thickness smaller than that of the first conductive portion; the first conductive portion is further disposed at one-side surfaces in the thickness direction of the second insulating portion and the third insulating portion or the second conductive portion is further disposed at one-side surfaces in the thickness direction of the first insulating portion and the third insulating portion; the second step includes a seventh step of disposing a third conductive layer having the same thickness as that of the first conductive portion at one-side surface in the thickness direction of the insulating layer, an eighth step of forming an etching resist at one-side surface in the thickness direction of the third conductive layer in the same pattern as that of the first conductive portion, and a ninth step of etching a one-side portion in the thickness direction of the third conductive layer exposed from the etching resist; and in the ninth step, the third conductive layer is etched by a portion corresponding to the thickness obtained by subtracting the thickness of the second conductive portion from that of the first conductive portion.

In the method, in the second step, the first conductive portion or the second conductive portion is disposed at one-side surface in the thickness direction of the third insulating portion. That is, in the eighth step, the end edge of the etching resist is disposed at one side in the thickness direction of the first insulating portion or the second insulating portion without being disposed at one side in the thickness direction of the third insulating portion in which the thickness changes. Thus, occurrence of retention of an etching solution is suppressed, and formation of a recessed portion based on over-etching can be suppressed in the third conductive layer. Thus, a shape defect of the conductive layer can be suppressed.

Also, a thick portion can be formed of two layers of the first insulating portion and the first conductive portion corresponding thereto, and a thin portion that is sufficiently thin compared to the thick portion can be formed of two layers of the second insulating portion and the second conductive portion corresponding thereto. Thus, both excellent flexibleness and excellent rigidity can be achieved by the thick portion and the thin portion.

According to the wired circuit board of the present invention, a shape defect of the conductive layer can be suppressed, and furthermore, both excellent flexibleness and excellent rigidity can be achieved.

According to the method for producing a wired circuit board of the present invention, a shape defect of the conductive layer can be suppressed, and furthermore, both excellent flexibleness and excellent rigidity can be achieved.

BRIEF DESCRIPTION OF THE DRAWINGS

FIG. 1 shows a partially enlarged cross-sectional view of a first embodiment (embodiment hi which a second wire portion is disposed on the upper surfaces of a third base portion and a first base portion) of a wired circuit board of the present invention.

FIGS. 2A to 2D show process drawings for illustrating a method for producing the wired circuit board shown in FIG. 1:

FIG. 2A illustrating a first step of preparing a base insulating layer,

FIG. 2B illustrating a third step of disposing a first conductive layer,

FIG. 2C illustrating a fourth step of disposing a photoresist, and a step of exposing the photoresist to light, and FIG. 2D illustrating a fifth step of developing the photoresist and forming a plating resist.

FIG. 3E illustrating a sixth step of forming a second conductive layer by plating, FIG. 3F illustrating a step of removing a plating resist, and FIG. 3G illustrating a tenth step of disposing a cover insulating layer.

FIG. 4 shows a partially enlarged cross-sectional view of a wired circuit board of Comparative Examples 1 and 2.

FIG. 5A illustrating a fourth step of disposing a photoresist, and a step of exposing the photoresist to light, FIG. 5B illustrating a fifth step of developing the photoresist and forming a plating resist having a protruding portion, FIG. 5C illustrating a sixth step of forming the second conductive layer in which a recessed portion is formed by plating, and FIG. 5D illustrating a step of removing the plating resist.

FIG. 6 shows a partially enlarged cross-sectional view of a modified example (embodiment in which a first wire portion is disposed on the upper surfaces of the third base portion and a second base portion) of the wired circuit board shown in FIG. 1.

FIGS. 7A to 7D show partial process drawings for illustrating a method for producing the wired circuit board shown in FIG. 6:

FIG. 7A illustrating a fourth step of disposing a photoresist, and a step of exposing the photoresist to light, FIG. 7B illustrating a fifth step of developing the photoresist and forming a plating resist, FIG. 7C illustrating a sixth step of forming the second conductive layer by plating, and FIG. 7D illustrating a step of removing the plating resist.

FIGS. 8A to 8C show partial process drawings of a second embodiment of a method liar producing a wired circuit board of the present invention:

FIG. 8A illustrating a seventh step of disposing a third conductive layer,

FIG. 8B illustrating a step of disposing a photoresist to be exposed to light, and FIG. 8C illustrating an eighth step of forming an etching resist.

FIG. 9D illustrating a ninth step of etching an upper-side portion of the second conductive layer exposed from the etching resist and FIG. 9E illustrating a step of removing the etching resist.

FIG. 10A illustrating an eighth step of funning an etching resist and

FIG. 10B illustrating a step of forming a conductive layer in which a second recessed portion is formed by etching a second conductive layer.

FIG. 11A illustrating a step of forming an etching resist,

FIG. 11B illustrating a ninth step of etching an upper-side portion of the second conductive layer exposed from the etching resist, and FIG. 11C illustrating a step of removing the etching resist.

DETAILED DESCRIPTION OF THE INVENTION

First Embodiment

Figure 3E:
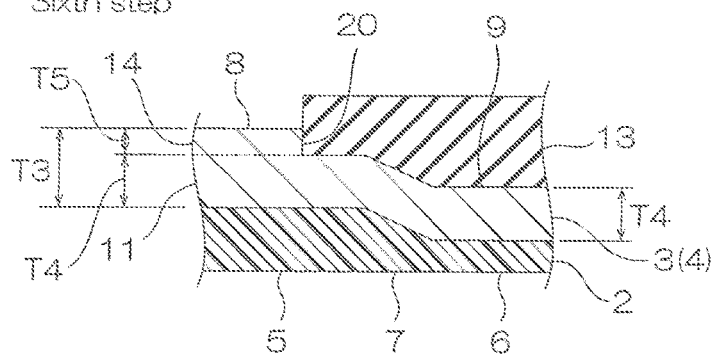
FIGS. 3E to 3G, subsequent to FIG. 2D, show process drawings for illustrating the method for producing the wired circuit board shown in FIG. 1.

A first embodiment of a wired circuit board and a method for producing the wired circuit board of the present invention is sequentially described with reference to FIGS. 1 to 3G.

1. Wired Circuit Board

A wired circuit board 1 has a generally flat plate shape extending in a longitudinal direction (right-left direction in FIG. 1). As shown in FIG. 1, the wired circuit board 1 sequentially includes a base insulating layer 2 as one example of an insulating layer, a conductive layer 3, and a cover insulating layer 10 in an up-down direction (one example of a thickness direction).

The base insulating layer 2 is the undermost layer in the wired circuit board 1. The base insulating layer 2 has the same shape when viewed from the top as that of the wired circuit board 1 when viewed from the top. The base insulating layer 2 continuously has, as one example of a first insulating portion, a first base portion 5 that is disposed at one side in the longitudinal direction, as one example of a second insulating portion, a second base portion 6 that is disposed at the other side in the longitudinal direction with respect to the first base portion 5 at spaced intervals thereto, and as one example of a third insulating portion, a third base portion 7 that is disposed between the first base portion 5 and the second base portion 6.

The first base portion 5 has the lower surface having a flat face in parallel in the longitudinal direction, and the upper surface facing the lower surface in the thickness direction and having a flat face in parallel in the longitudinal direction. The first base portion 5 has a thickness T1 that is relatively large. The thickness T1 is the shortest-distance length between the upper surface and the lower surface of the first base portion 5. The thickness T1 of the first base portion 5 is the same over the longitudinal direction. The following thickness is in accordance with the definition of the thickness T1 of the first base portion 5 described above. The details of the thickness T1 are described later.

The second base portion 6 has the lower surface having a flat face in parallel in the longitudinal direction, and the upper surface facing the lower surface in the thickness direction and having a flat face in parallel in the longitudinal direction. The upper surface of the second base portion 6 is positioned at the lower side with respect to the upper surface of the first base portion 5 when projected in the longitudinal direction. The second base portion 6 has a thickness T2 (relatively small thickness) that is smaller than the thickness T1 of the first base portion 5. The thickness T2 of the second base portion 6 is the same over the longitudinal direction. The details of the thickness T2 are described later.

The third base portion 7 has the lower surface having a flat face in parallel in the longitudinal direction, and the upper surface having a flat face inclining in the longitudinal direction. In the third base portion 7, a phantom face along the lower surface crosses a phantom face along the upper surface. The upper surface of the third base portion 7 inclines so as to get closer to the lower surface from one side toward the other side in the longitudinal direction.

The lower surface of the third base portion 7 connects the other end edge in the longitudinal direction of the lower surface of the first base portion 5 to one edge in the longitudinal direction of the lower surface of the second base portion 6. The upper surface of the third base portion 7 connects the other end edge in the longitudinal direction of the upper surface of the first base portion 5 to one end edge in the longitudinal direction of the upper surface of the second base portion 6.

The third base portion 7 has a thickness T that gradually becomes smaller from the first base portion 5 toward the second base portion 6.

The third base portion 7 has a generally snip shape extending long in a width direction perpendicular to the longitudinal direction and the thickness direction (though not shown in FIG. 1, a depth direction in FIG. 1) when viewed from the top.

The base insulating layer 2 is, for example, made of an insulating material such as a synthetic resin including polyimide resin, polyamide imide resin, acrylic resin, polyether nitrile resin, polyether sulfone resin, polyethylene terephthalate resin, polyethylene naphthalate resin, and polyvinyl chloride resin.

The thickness T1 of the first base portion 5 is, for example, 5 μm or more, preferably 6 μm or more, more preferably 7 μm or more, and for example, 20 μm or less.

The thickness T2 of the second base portion 6 is smaller than the thickness T1 of the first base portion 5 and to be specific, for example, 9 μm or less, preferably 8 μm or less, more preferably 7 μm or less, and for example, 1 μm or more. The ratio (T1/T2) of the thickness T1 of the first base portion 5 to the thickness T2 of the second base portion 6 is, for example, 1.1 or more, preferably 1.3 or more, more preferably 1.5 or more, and for example, 6 or less.

A length L1 in the longitudinal direction of the third base portion 7 is, for example, 5 μm or more, preferably 10 μm or more, and for example, 50 μm or less, preferably 30 μm or less.

A supplementary angle α of an angle α' of an obtuse angle between the upper surface of the third base portion 7 and the upper surface of the first base portion 5 is not particularly limited, and for example, 5 degrees or more, preferably 10 degrees or more, and for example, below 90 degrees, preferably 60 degrees or less. A supplementary angle β of an angle β' of an obtuse angle between the upper surface of the third base portion 7 and the upper surface of the second base portion 6 is not particularly limited, and for example, 5 degrees or more, preferably 10 degrees or more, and for example, below 90 degrees, preferably 60 degrees or less. Preferably, the above-described supplementary angle α and the above-described supplementary angle β are the same.

The conductive layer 3 is disposed on the upper surface of the base insulating layer 2. The conductive layer 3 integrally includes wires 4 extending in the longitudinal direction and terminals (not shown) connected to both end portions in the longitudinal direction of the wires 4.

The plurality of wires 4 are disposed in alignment at spaced intervals to each other in the width direction. The plurality of wires 4 are differential wires that transmit differential signals (read signals and/or write signals). The differential wires can include, for example, interleave wires described in Japanese Unexamined Patent Publications No. 2016-167334 and No. 2016-6705, and wires used in TDMR (two dimensional magnetic recording). The number of wires 4 is not particularly limited, and may be 2, 4, 6, 8, or above 8.

Each of the plurality of wires 4 continuously has, as one example of a first conductive portion, a first wire portion 8 and as one example of a second conductive portion, a second wire portion 9.

The first wire portion 8 is disposed at one side in the longitudinal direction of the wire 4. To be specific, the first wire portion 8 is disposed on the upper surface of the first base portion 5. To be more specific, the first wire portion 8 is disposed on the upper surface other than the other end portion in the longitudinal direction of the first base portion 5. The first wire portion 8 has the lower surface having a flat face in parallel in the longitudinal direction, and the upper surface facing the lower surface in the thickness direction and having a flat face in parallel in the longitudinal direction. The lower surface of the first wire portion 8 is in contact with the upper surface of the first base portion 5.

The first wire portion 8 has a thickness T3 that is the same over the longitudinal direction. The details of the thickness T3 are described later.

The second wire portion 9 is disposed at the other side in the longitudinal direction of the wire 4, and is disposed at the other side in the longitudinal direction of the first wire portion 8. The second wire portion 9 is continuous to the other end edge in the longitudinal direction of the first wire portion 8. The second wire portion 9 extends from the lower-side portion at the other end edge surface in the longitudinal direction of the first wire portion 8 toward the other side in the longitudinal direction.

The second wire portion 9 is continuously disposed on the upper surface of the second base portion 6, the upper surface of the third base portion 7, and the upper surface of the other end portion in the longitudinal direction of the first base portion 5. The second wire portion 9 has the lower surface in contact with the upper surface of the second base portion 6, the upper surface of the third base portion 7, and the upper surface of the other end portion in the longitudinal direction of the first base portion 5 and the upper surface facing the lower surface in the thickness direction. The lower surface of the second wire portion 9 is in contact with the upper surface of the second base portion 6, the upper surface of the third base portion 7, and the upper surface of the other end portion in the longitudinal direction of the first base portion 5, and follows the upper surface of each of the base portions (the second base portion 6, the third base portion 7, and the first base portion 5) described above. The upper surface of the second wire portion 9 is spaced apart from the lower surface of the second wire portion 9 at the upper side thereof so as to ensure a thickness T4 to be described later.

To be more specific, the thickness T4 of the second wire portion 9 is the same over the longitudinal direction. To be specific, the upper surface of the second wire portion 9 that is disposed on the upper surface of the other end portion in the longitudinal direction of the first base portion 5 is in parallel with the upper surface of the other end portion in the longitudinal direction of the first base portion 5. The upper surface of the second wire portion 9 that is disposed on the upper surface of the second base portion 6 is in parallel with the upper surface of the second base portion 6. Meanwhile, the upper surface of the second wire portion 9 that is disposed on the upper surface of the third base portion 7 has an inclined surface that is in parallel with the inclined surface included in the upper surface of the third base portion 7.

The second wire portion 9 that is disposed on the upper surface of the other end portion in the longitudinal direction of the first base portion 5, the second wire portion 9 that is disposed on the upper surface of the second base portion 6, and the second wire portion 9 that is disposed on the upper surface of the third base portion 7 have the same thickness T4.

The second wire portion 9 has the thickness T4 that is smaller than the thickness T3 of the first wire portion 8. The thickness T4 of the second wire portion 9 is the same over the longitudinal direction. The details of the thickness T4 are described later.

The wire 4 continuously has the first wire portion 8 and the second wire portion 9 each having a different thickness, so that the upper surface of the other end portion in the longitudinal direction of the first wire portion 8 and the upper surface of one end portion in the longitudinal direction of the second wire portion 9 make a difference in level.

The other end edge in the longitudinal direction of the upper surface of the first wire portion 8 described above is connected to one end edge in the longitudinal direction of the upper surface of the second wire portion 9 by a connecting surface 20. The connecting surface 20 makes the above-described difference in level. The connecting surface 20 is disposed on the first base portion 5. The connecting surface 20 is displaced (disposed offset) from the third base portion 7 to one side in the longitudinal direction. The connecting surface 20 is a flat face extending along the thickness direction and the width direction (though not shown in FIG. 1, the depth direction in FIG. 1).

The conductive layer 3 is, for example, made of a conductive material such as copper, nickel, gold, solder, or an alloy thereof.

The width of the wire 4 and the interval between the wires 4 are appropriately set in accordance with its usages and purpose.

The thickness T3 of the first wire portion 8 is, for example, 6 μm or more, preferably 7 μm or more, more preferably 8 μm or more, and for example, 18 μm or less.

The thickness T4 of the second wire portion 9 is smaller than the thickness T3 of the first wire portion 8, and to be specific, for example, 8 μm or less, preferably 7 μm or less, more preferably 6 μm or less, and for example, 2 μm or more. The ratio (T3/T4) of the thickness T3 of the first wire portion 8 to the thickness T4 of the second wire portion 9 is, for example, 1.1 or more, preferably 1.2 or more, more preferably 1.3 or more, and for example, 5 or less.

A length T5 in the thickness direction of the connecting surface 20 is a value (T3−T4) obtained by subtracting the thickness T4 of the second wire portion 9 from the thickness T3 of the first wire portion 8, and to be specific, for example, 1 μm or more, preferably 3 μm or more, and for example, 10 μm or less, preferably 8 μm or less. The ratio of the length T5 in the thickness direction of the connecting surface 20 to the thickness T3 of the first wire portion 8 is, for example, 1.1 or more, preferably 1.5 or more, and for example, 8 or less, preferably 5 or less.

The cover insulating layer 10 is the topmost layer in the wired circuit board 1. The cover insulating layer 10 has a pattern covering the wires 4 and exposing the terminals that are not shown on the base insulating layer 2. The cover insulating layer 10 is made of the same insulating material as that of the base insulating layer 2. The thickness of the cover insulating layer 10 is, for example, 1 μm or more, preferably 3 μm or more, and for example, 40 μm or less, preferably 10 μm or less.

The cover insulating layer 10 has the same thickness over the longitudinal direction.

2. Method for Producing Wired Circuit Board

Figure 3F:
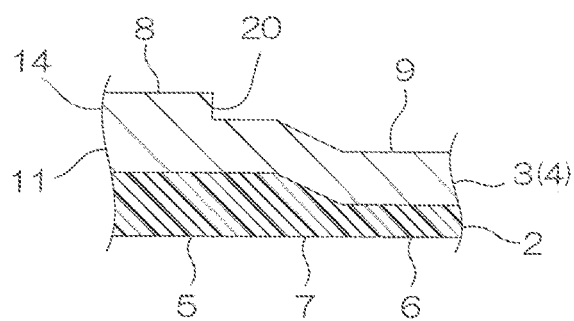
Figure 3G:
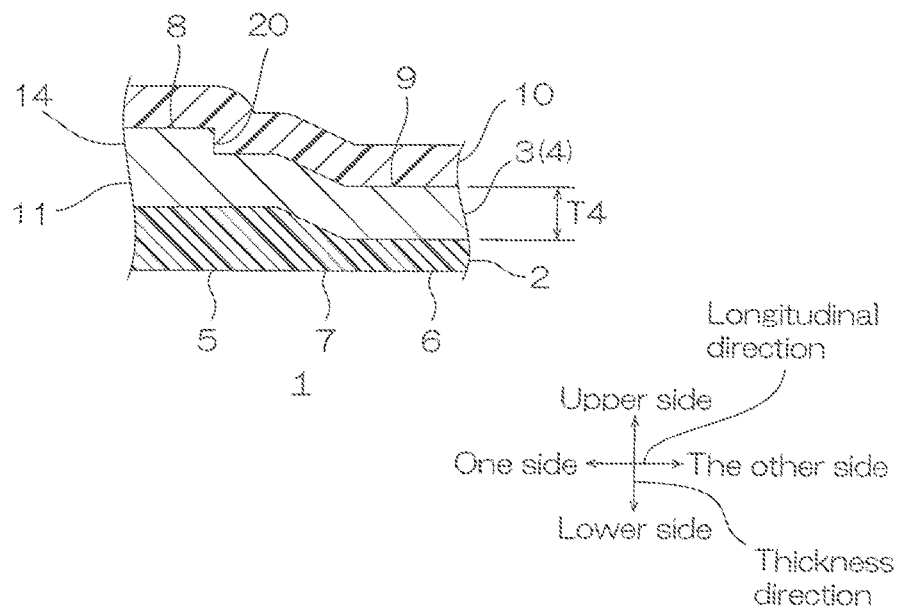

As shown in FIGS. 2A to 3G, the method for producing the wired circuit board 1 sequentially includes a first step (ref: FIG. 2A) of preparing the base insulating layer 2, a second step (ref: FIGS. 2B to 3F) of disposing the conductive layer 3 on the upper surface (one example of one-side surface in the thickness direction) of the base insulating layer 2, and a tenth step (ref: FIG. 3G) of disposing the cover insulating layer 10.

2-1. First Step

As shown in FIG. 2A, in the first step, the base insulating layer 2 is famed so as to continuously have the first base portion 5, the second base portion 6, and the third base portion 7.

For example, a photosensitive insulating material is applied to a substrate (not shown) to prepare a coated film; next, the coated film is exposed to light via a gradation photomask; and subsequently, the resulting coated film is heated after the exposure to light as needed to be then developed, so that the base insulating layer 2 continuously having the first base portion 5, the second base portion 6, and the third base portion 7 is formed.

2-2. Second Step

The second step includes a third step (ref: FIG. 2B), a fourth step (ref: FIG. 2C), a fifth step (ref: FIG. 2D), and a sixth step (ref: FIGS. 3E and 3F). The third step, the fourth step, the fifth step, and the sixth step are sequentially performed.

(A) Third Step

As shown in FIG. 2B, in the third step, a first conductive layer 11 having the same thickness 14 as the thickness T4 (ref: FIG. 3E) of the second wire portion 9 is disposed on the upper surface of the base insulating layer 2.

The first conductive layer 11 is made of the same conductive material as that of the conductive layer 3.

To dispose the first conductive layer 11 on the upper surface of the base insulating layer 2, for example, an additive method is used. To be specific, for example, a first conductive thin film (not shown) is disposed on the entire upper surface of the base insulating layer 2. Next, a plating resist (not shown) is formed on the upper surface of the first conductive thin film in a pattern reverse to the conductive layer 3. Next, by plating, the first conductive layer 11 is formed in a portion that is exposed from the plating resist (not shown) on the upper surface of the first conductive thin film in the same pattern as that of the conductive layer 3.

Thereafter, the plating resist (not shown) and the first conductive thin film (not shown) exposed from the first conductive layer 11 are sequentially removed.

(B) Fourth Step

As shown in FIG. 2C, in the fourth step, a photoresist 12 is disposed on the entire upper surface of the first conductive layer 11.

Examples of the photoresist 12 include a negative-type photoresist (negative photoresist) and a positive-type photoresist (positive photoresist). Preferably, a negative-type photoresist is used. The photoresist 12 includes a dry film resist (DFR).

The thickness of the photoresist 12 is not particularly limited as long as it is not less than the thickness T5 of the second conductive layer 14 that is disposed in the sixth step shown in FIG. 3E.

(C) Fifth Step

As shown in FIGS. 2C and 2D, in the fifth step, the photoresist 12 is exposed to light and developed, so that a plating resist 13 is formed in a pattern reverse to the first wire portion 8.

When the photoresist 12 is the negative-type photoresist, a photomask 19 including a translucent portion 17 that corresponds to the plating resist 13 and a light shield portion 18 that does not correspond to the plating resist 13 is disposed above the photoresist 12. A border 22 between the translucent portion 17 and the light shield portion 18 is disposed in opposed relation to the upper side of the first base portion 5. The border 22 is displaced from the third base portion 7 to one side in the longitudinal direction.

Next, the photoresist 12 is exposed to light via the photomask 19. Next, the photoresist 12 is heated after the exposure to light as needed.

Thereafter, the photoresist 12 is developed, so that in the photoresist 12, a portion that is exposed to light (exposed) remains, and an unexposed portion in the photoresist 12 is removed. In this manner, the plating resist 13 having a pattern reverse to the first wire portion 8 (ref: FIG. 3E) is formed. The plating resist 13 is formed on the upper surface of the other-side end portion in the longitudinal direction of the first base portion 5, the upper surface of the third base portion 7, and the upper surface of the second base portion 6.

(D) Sixth Step

As shown in FIG. 3E, in the sixth step, a second conductive layer 14 is formed in a portion that is exposed from the plating resist 13 on the upper surface of the first conductive layer 11 by plating.

The second conductive layer 14 is made of the same conductive material as that of the conductive layer 3.

The second conductive layer 14 is laminated in a portion that is exposed from the plating resist 13 on the upper surface of the first conductive layer 11.

The thickness T5 of the second conductive layer 14 is, for example, 1 μm or more, preferably 3 μm or more, and for example, 10 μm or less, preferably 8 μm or less.

By the above-described plating, in the portion that is exposed from the plating resist 13, the total thickness of the thickness T4 of the first conductive layer 11 and the thickness T5 of the second conductive layer 14 is the same as the thickness T3 of the first wire portion 8.

In tins manner, the wire 4 continuously having the first wire portion 8 made of a laminate of the first conductive layer 11 and the second conductive layer 14, and the second wire portion 9 made of the first conductive layer 11 is formed. Simultaneously, the terminal (not shown) continuous to the wire 4 is formed.

Thereafter, as shown in FIG. 3F, in the sixth step, the plating resist 13 is removed.

As shown in FIG. 3G, in the tenth step, the cover insulating layer 10 is disposed on the base insulating layer 2 by a known method in the above-described pattern.

In this manner, the wired circuit board 1 sequentially including the base insulating layer 2, the conductive layer 3, and the cover insulating layer 10 is produced.

Function and Effect of First Embodiment

According to the wired circuit board 1 shown in FIG. 1, the thick portion can be formed of the two layers of the first base portion 5 and the first wire portion 8, and the thin portion that is sufficiently thin compared to the thick portion can be formed of the two layers of the second base portion 6 and the second wire portion 9 corresponding thereto. Thus, both excellent flexibleness and excellent rigidity can be achieved by the thick portion and the thin portion.

The second wire portion 9 is disposed on the upper surface of the third base portion 7. That is, the border between the first wire portion 8 and the second wire portion 9 is not disposed on the upper surface of the third base portion 7 in which the thickness changes, that is, is disposed on the upper surface of the first base portion 5 that is displaced from the third base portion 7 to one side in the width direction. Thus, the border between the first wire portion 8 and the second wire portion 9 can be surely formed, and a shape defect of the conductive layer 3 can be suppressed.

Meanwhile, as shown in FIG. 4, Comparative Example 1 in which the other end edge (the connecting surface 20 positioned therein) in the longitudinal direction of the first wire portion 8 is disposed on the upper surface of the third base portion 7 in which the thickness changes is considered.

Figure 5A:
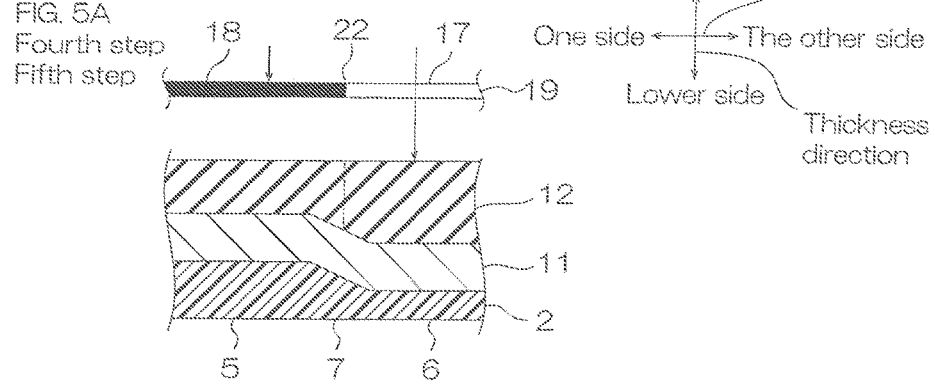
FIGS. 5A to 5D show partial process drawings for illustrating a method for producing the wired circuit board of Comparative Example 1 shown in FIG. 4.

To produce the wired circuit hoard 1 shown in FIG. 4, in the fourth step shown in FIG. 5A, first, the photomask 19 is disposed above the photoresist 12 so that the translucent portion 17 faces the other end portion in the longitudinal direction of the third base portion 7 and the second base portion 6, and the light shield portion 18 faces one end portion in the longitudinal direction of the third base portion 7 and the first base portion 5. That is when the photomask 19 is disposed above the photoresist 12, the border 22 between the translucent portion 17 and the light shield portion 18 is disposed above the third base portion 7. Subsequently, the photoresist 12 is exposed to light via the photomask 19.

Figure 5B:
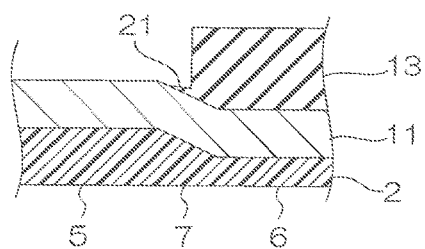

Thereafter, as shown in FIG. 5B, the photoresist 12 is developed. To be specific, a developer is brought into contact with the photoresist 12. At this time, in the photoresist 12, the entire unexposed portion (portion facing the light shield portion 18) should be removed. However, in the neighborhood of the upper side of the third base portion 7, the upper surface of the third base portion 7 has the inclined surface, and the upper surface of the first conductive layer 11 that is disposed on the upper surface thereof also has the inclined surface, so that the developer tends to be retained. Thus, in the plating resist 13, a protruding portion (pointed portion) 21 that protrudes (is pointed) toward one side in the longitudinal direction unintentionally remains (is formed) in the lower end portion of one end edge in the longitudinal direction thereof.

Figure 5C:
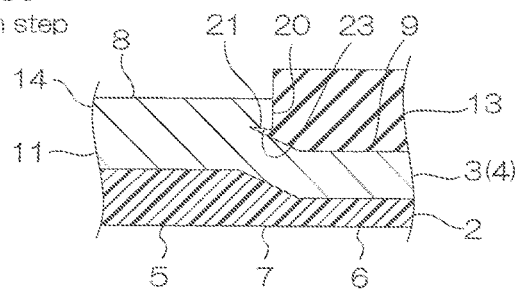
Figure 5D:
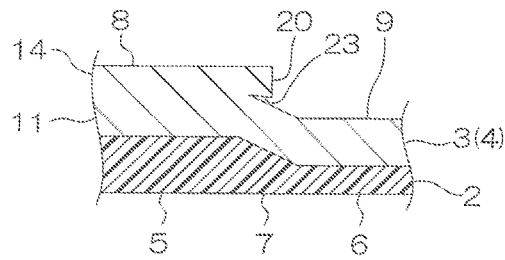

Thereafter, as shown in FIG. 5C, in the sixth step, a portion that is exposed from the plating resist 13 including the protruding portion 21 on the upper surface of the first conductive layer 11 is subjected to plating. Then, in the first wire portion 8 made of the first conductive layer 11 and the second conductive layer 14, a first recessed portion 23 corresponding to the protruding portion 21 is formed. To be more specific, the first recessed portion 23 that is recessed toward one side in the longitudinal direction is formed in the lower end portion of the connecting surface 20. Thus, the entire surface of the connecting surface 20 cannot ensure the flat face.

As a result, a shape defect of the wire 4 occurs.

However, in the first embodiment, in the second step, as shown in FIG. 3F, the second wire portion 9 is disposed on the upper surface of the third base portion 7. That is, as shown in FIG. 2C, in the fifth step, the border 22 between the translucent portion 17 and the light shield portion 18 in the photomask 19 is disposed above the first base portion 5 that is displaced from the third base portion 7 to one side in the longitudinal direction. Thus, as shown in FIG. 2D, one end edge in the longitudinal direction of the plating resist 13 is not disposed on the upper surface of the third base portion 7 in which the thickness changes, that is, is disposed on the flat upper surface of the first base portion 5 that is displaced from the third base portion 7 to one side in the longitudinal direction. Then, in the developing of the photoresist 12, the above-described occurrence of retention of the developer is suppressed, formation of the protruding portion 21 shown in FIG. 5B can be suppressed, and therefore, formation of the recessed portion 23 shown in FIG. 5C can be suppressed. Thus, the connecting surface 20 included in one end edge in the longitudinal direction of the first wire portion 8 can be surely formed into a desired shape, and a shape defect of the wire 4 can be suppressed.

Modified Example of First Embodiment

In the modified example, the same reference numerals are provided for members and steps corresponding to those described in the first embodiment, and their detailed description is omitted.

As shown in FIG. 1, in the first embodiment, the connecting surface 20 is disposed above the first base portion 5. That is, the second wire portion 9 is further disposed on the upper surfaces of the third base portion 7 and the first base portion 5 in addition to the upper surface of the second base portion 6.

However, as shown in FIG. 6, is the modified example, the connecting surface 20 is disposed above the second base portion 6. That is, the first wire portion 8 is further disposed on the upper surfaces of the third base portion 7 and the second base portion 6 in addition to the upper surface of the first base portion 5.

In the modified example, the second wire portion 9 is disposed on only the upper surface of the second base portion 6 without being disposed on the upper surfaces of the third base portion 7 and the first base portion 5.

To produce the wired circuit board 1 shown in FIG. 6, as shown in FIG. 7A, in the fifth step, the border 22 between the translucent portion 17 and the light shield portion 18 in the photomask 19 is disposed in opposed relation to the upper side of the second base portion 6. That is, the border 22 is displaced from the third base portion 7 to the other side in the longitudinal direction. Thereafter, when the photoresist 12 is developed, as shown in FIG. 7B, one end edge in the longitudinal direction of the plating resist 13 is funned on the upper surface of the second base portion 6.

As shown in FIG. 7C, in the sixth step, the second conductive layer 14 is formed in a portion that is exposed from the plating resist 13 on the upper surface of the first conductive layer 11 by plating.

As shown in FIG. 1D, thereafter, the plating resist 13 is removed.

In the modified example, the same function and effect as that of the first embodiment can be achieved. To be specific, in the modified example, as shown in FIG. 6, the first wire portion 8 is disposed on the upper surface of the third base portion 7. That is, as shown in FIG. 7A, in the fifth step, the border 22 between the translucent portion 17 and the light shield portion 18 in the photomask 19 is disposed above the second base portion 6. Thus, as shown in FIG. 7B, one end edge in the longitudinal direction of the plating resist 13 is not disposed on the upper surface of the third base portion 7 in which the thickness changes, that is, is disposed on the flat upper surface of the second base portion 6 that is displaced from the third base portion 7 to the other side in the longitudinal direction. Then, in the developing of the photoresist 12, the above-described occurrence of retention of the developer is suppressed, formation of the protruding portion 21 shown in FIG. 5B can be suppressed, and therefore, formation of the recessed portion 23 shown in FIG. 5C can be suppressed. Thus, the connecting surface 20 included in one end edge in the longitudinal direction of the first wire portion 8 can be surely formed into a desired shape, and a shape defect of the wire 4 can be suppressed.

Second Embodiment

In the second embodiment, the same reference numerals are provided for members and steps corresponding to those described in the first embodiment, and their detailed description is omitted.

In the first embodiment, in the second step, the conductive layer 3 is formed by the additive method.

However, as shown in FIGS. 8A to 9E, the conductive layer 3 can be also formed by a subtractive method.

Figure 9D:
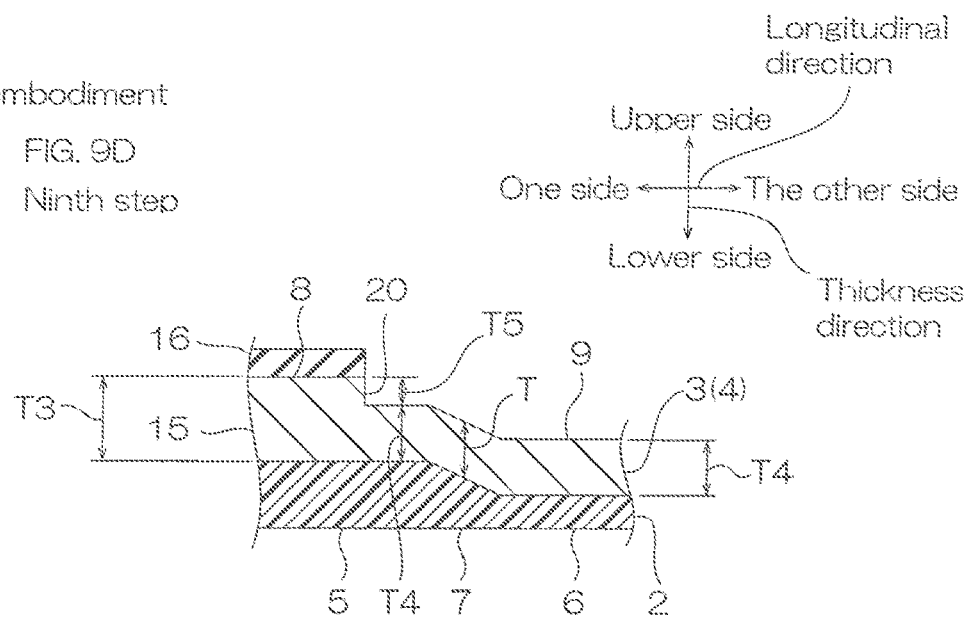
FIGS. 9D to 9E, subsequent to FIG. 8C, show partial process drawings of the second embodiment of the method for producing the wired circuit board of the present invention.
Figure 9E:
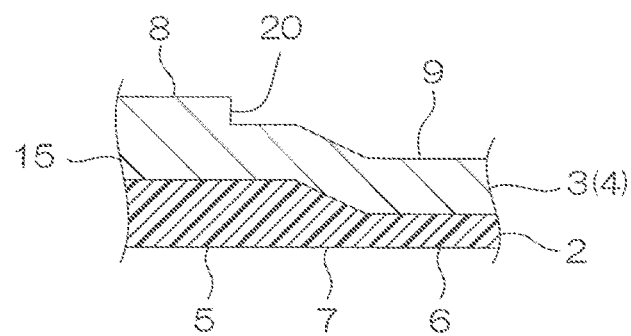

The second step of the second embodiment includes a seventh step (ref: FIGS. 8A and 8B), an eighth step (ref: FIG. 8C), and a ninth step (ref: FIGS. 9D and 9E). The seventh step, the eighth step, and the ninth step are sequentially performed.

(A) Seventh Step

As shown in FIG. 8A, in the seventh step, a third conductive layer 15 having the same thickness T3 as the thickness T3 (ref: FIG. 9D) of the first wire portion 8 is disposed on the upper surface of the base insulating layer 2. For example, a conductive sheet that is not shown adheres to the upper surface of the base insulating layer 2 via an adhesive, and thereafter, the conductive sheet (not shown) is etched, thereby forming the third conductive layer 15.

(B) Eighth Step

As shown in FIGS. 8B and 8C, in the eighth step, an etching resist 16 (ref: 8C) is formed on the upper surface of the third conductive layer 15 in the same pattern as that of the first wire portion 8.

To be specific, as shown in FIG. 8B, first, the photoresist 12 is disposed on the upper surface of the base insulating layer 2 so as to cover the entire upper surface of the third conductive layer 15.

Next, the photomask 19 is disposed above the photoresist 12 so that the translucent portion 17 faces the upper side of one end portion in the longitudinal direction of the first base portion 5, and the light shield portion 18 faces the upper side of the other end portion in the longitudinal direction of the first base portion 5, the third base portion 7, and the second base portion 6. That is, when the photomask 19 is disposed above the photoresist 12, the border 22 between the translucent portion 17 and the light shield portion 18 is disposed above the first base portion 5. That is, the border 22 is displaced from the third base portion 7 to one side in the longitudinal direction. Subsequently, the photoresist 12 is exposed to light via the photomask 19. Thereafter, the photoresist 12 is developed.

In this manner, the etching resist 16 is formed in the same pattern as that of the first wire portion 8. The other end edge in the longitudinal direction of the etching resist 16 is disposed on the upper surface of the first base portion 5. That is, the other end edge in the longitudinal direction of the etching resist 16 is displaced from the third base portion 7 to the other side in the longitudinal direction.

(C) Ninth Step

As shown in FIG. 9D, in the ninth step, an upper-side portion 24 (ref: FIG. 8C) of the third conductive layer 15 that is exposed from the etching resist 16 is etched.

To be specific, the third conductive layer 15 in which a part thereof is covered with the etching resist 16 is immersed in (exposed to) an etching solution.

In this manner, the upper-side portion 24 (ref: FIG. 8C) in the third conductive layer 15 that is exposed from the etching resist 16 is removed.

At this time, the upper-side portion 24 of the third conductive layer 15 is etched by a portion corresponding to the thickness T5 obtained by subtracting the thickness T4 of the second wire portion 9 from the thickness T3 of the first wire portion 8.

In this manner, the conductive layer 3 is formed.

Function and Effect of Second Embodiment

As shown in FIG. 4, the method for producing the wired circuit board 1 (Comparative Example 2) in which the other end edge (the connecting surface 20 positioned therein) in the longitudinal direction of the first wire portion 8 is disposed on the upper surface of the third base portion 7 in which the thickness changes is considered.

Figure 10A:
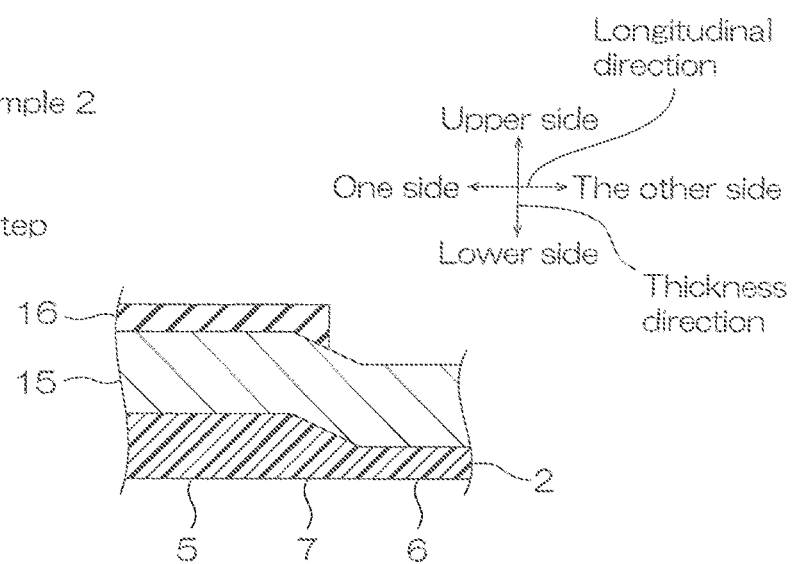
FIGS. 10A and 10B show partial process drawings for illustrating a method for producing the wired circuit board of Comparative Example 2.

When the conductive layer 3 of the wired circuit board 1 shown in FIG. 4 is produced by the subtractive method, in the eighth step shown in FIG. 10A, the other end edge in the longitudinal direction of the etching resist 16 is disposed on the upper surface of the third base portion 7. The other end edge in the longitudinal direction of the etching resist 16 is overlapped with the third base portion 7 when viewed from the top.

Figure 10B:
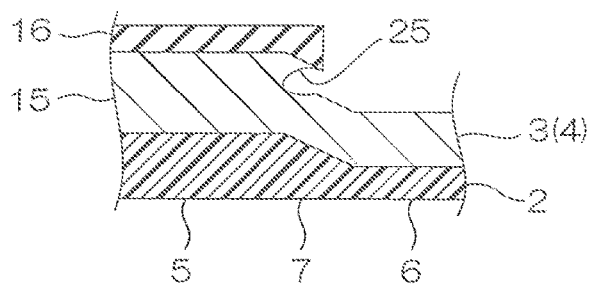

Subsequently, in the ninth step shown in FIG. 10B, when the third conductive layer 15 is immersed in (exposed to) an etching solution, in the neighborhood of the upper surface of the third conductive layer 15 that is exposed from the other end edge in the longitudinal direction of the etching resist 16, the upper surface of the third conductive layer 15 that is disposed on the upper surface (the inclined surface) of the third base portion 7 has the inclined surface, so that retention of the etching solution easily occurs. Thus, as shown in FIG.

10B, a second recessed portion 25 caused by over-etching is formed in the third conductive layer 15 facing the third base portion 7. Thus, a shape detect of the conductive layer 3 occurs.

However, in the second embodiment, as shown in FIG. 8C, in the eighth step, the other cud edge in the longitudinal direction of the etching resist 16 is disposed on the upper surface of the first base portion 5 without being disposed on the upper surface of the third base portion 7 in which the thickness changes. Thus, occurrence of retention of the etching solution described above is suppressed, and formation of the second recessed portion 25 shown in FIG. 10B based on over-etching can be suppressed in the third conductive layer 15. Thus, a shape defect of the conductive layer 3 can be suppressed.

Modified Example of Second Embodiment

In the modified example, the same reference numerals are provided for members and steps corresponding to those described in the first and second embodiments, and their detailed description is omitted.

The wired circuit board 1 that is shown in FIG. 6 and in which the first wire portion 8 is further disposed on the upper surfaces of the third base portion 7 and the second base portion 6 in addition to the upper surface of the first base portion 5 can be also produced in the same manner as that of the second embodiment.

Figure 11A:
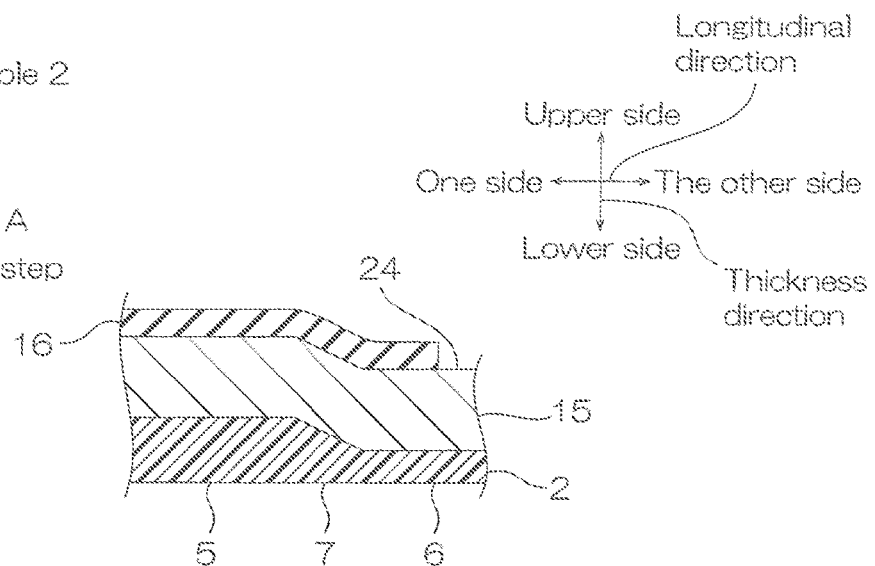
FIGS. 11A to 11C show partial process drawings of a modified example of the second embodiment.

In the method for producing the wired circuit board 1, as shown in FIG. 11A, in the eighth step, the other end edge in the longitudinal direction of the etching resist 16 is disposed on the upper surface of the second base portion 6.

Figure 11B:
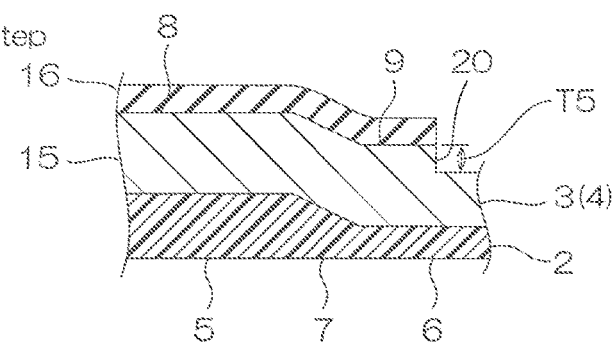

As shown in FIG. 11B, in the ninth step, the upper-side portion 24 (ref: FIG. 11A) of the third conductive layer 15 that is exposed from the etching resist 16 is etched.

Figure 11C:
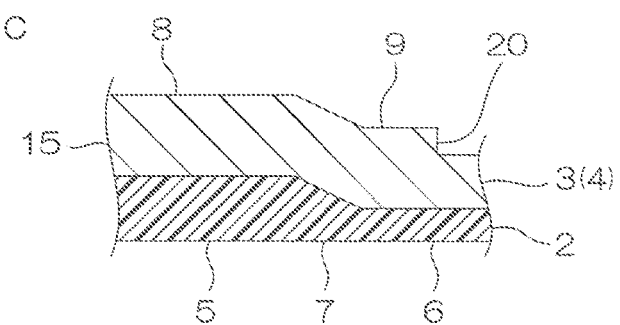

Thereafter, as shown in FIG. 11C, the etching resist 6 is removed.

In this manner, the conductive layer 3 is formed.

In the modified example, the same function and effect as that of the second embodiment can be also achieved.

Modified Example of First and Second Embodiments

The above-described first and second embodiments can be appropriately used in combination. For example, in the third step in the first embodiment shown in FIG. 2B, the first conductive layer 11 is formed by plating. Alternatively, for example, the first conductive layer 11 can be also formed by etching of the conductive sheet.

In the seventh step in the second embodiment shown in FIG. 8A, the third conductive layer 15 is formed by etching of the conductive sheet. Alternatively, for example, the third conductive layer 15 can be also formed by plating.

Furthermore, in the above-described description, the first wire portion 8 and the second wire portion 9 each having a different thickness are provided in the wire. Alternatively, for example, the first conductive portion and the second conductive portion each having a different thickness can be also provided in a terminal that is not shown.

Furthermore, in the first and second embodiments, as one example of the wired circuit board of the present invention, the wired circuit board 1 including the base insulating layer 2, the conductive layer 3, and the cover insulating layer 10 is used. Alternatively, for example, as shown by phantom lines in FIGS. 1 and 6, a suspension board with circuit 30 further provided with a metal supporting layer 26 on the lower surface of the base insulating layer 2 and including the metal supporting layer 26, the base insulating layer 2, the conductive layer 3, and the cover insulating layer 10 can be also used. Furthermore, a flexible wired circuit board including, as a reinforcement layer, the metal supporting layer 26, and the base insulating layer 2, the conductive layer 3, and the cover insulating layer 10 can be also used.

In the modified example, the same function and effect as that of the above-described first and second embodiments can be also achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board comprising: an insulating layer and a conductive layer disposed at one-side surface in a thickness direction of the insulating layer, wherein the insulating layer continuously has a first insulating portion, a second insulating portion having a thickness smaller than that of the first insulating portion, and a third insulating portion disposed between the first insulating portion and the second insulating portion and having a thickness that tapers gradually and becomes smaller from the first insulating portion toward the second insulating portion; the conductive layer continuously has a first conductive portion disposed at one-side surface in the thickness direction of the first insulating portion and a second conductive portion disposed at one-side surface in the thickness direction of the second insulating portion and having a thickness smaller than that of the first conductive portion; and the first conductive portion is further disposed at one-side surfaces in the thickness direction of the second insulating portion and the third insulating portion or the second conductive portion is further disposed at one-side surfaces In the thickness direction of the first insulating portion and the third insulating portion.

2. A method for producing a wired circuit board comprising; a first step of preparing an insulating layer and a second step of disposing a conductive layer at one-side surface in a thickness direction of the insulating layer, wherein the insulating layer continuously has a first insulating portion, a second Insulating portion having a thickness smaller than that of the first insulating portion, and a third insulating portion disposed between the first insulating portion and the second insulating portion and having a thickness that tapers gradually and becomes smaller from the first, insulating portion toward the second insulating portion; the conductive layer continuously has a first conductive portion disposed at one-side surface in the thickness direction of the first insulating portion and a second conductive portion disposed at one-side surface in the thickness direction of the second insulating portion and having a thickness smaller than that of the first conductive portion; the first conductive portion is further disposed at one-side surfaces in the thickness direction, of the second insulating portion and the third insulating portion or the second conductive portion is further disposed at one-side surfaces in the thickness direction of the first insulating portion and the third insulating portion; the second step includes a third step of disposing a first conductive layer having the same thickness as that of the second conductive portion at one-side surface in the thickness direction of the insulating layer, a fourth step of disposing a photoresist at the entire one-side surface in the thickness direction of the first conductive layer, a fifth step of forming a plating resist in a pattern reverse to the first conductive portion by exposing the photoresist to light to be developed, and a sixth step of forming a second conductive layer at one-side surface in the thickness direction of the first conductive layer exposed from the plating resist by plating; and in the sixth step, plating is performed so that the total thickness of the first conductive layer and the second conductive layer is the same as die thickness of the first conductive portion.

3. A method for producing a wired circuit board comprising: a first step of preparing an Insulating layer and a second step of forming a conductive layer at one-side surface in a thickness direction of the insulating layer, wherein tire insulating layer continuously has a first insulating portion, a second insulating portion having a thickness smaller than that of the first Insulating portion, and a third insulating portion disposed between tire first insulating portion and the second insulating portion and having a thickness that tapers gradually and becomes smaller from the first insulating portion toward the second insulating portion; the conductive layer continuously has a first conductive portion disposed at one-side surface in the thickness direction of the first insulating portion and a second conductive portion disposed at one-side surface in the thickness direction of the second insulating portion and having a thickness smaller than that of the first conductive portion; the first conductive portion is farther disposed at one-side surfaces in the thickness direction of the second Insulating portion and the third insulating portion or the second conductive portion is further disposed at one-side surfaces in the thickness direction of the first insulating portion and the third insulating portion; the second step includes a third step of disposing a third conductive layer having the same thickness as that of the first conductive portion at one-side surface in the thickness direction of the insulating layer, an fourth step of forming an etching resist at one-side surface in the thickness direction of the third conductive layer in the same pattern as that of the first conductive portion, and a fifth step of etching a one-side portion in the thickness direction of the third conductive layer exposed from the etching resist; and in the fifth step, the third conductive layer is etched by a portion corresponding to the thickness obtained by subtracting the thickness of the second conductive portion from that of the first conductive portion.

\* \* \* \* \*